US010951109B2

(12) United States Patent
Whitehouse et al.

(10) Patent No.: US 10,951,109 B2
(45) Date of Patent: Mar. 16, 2021

(54) LINE COMMUTATED CONVERTERS

(71) Applicant: GENERAL ELECTRIC TECHNOLOGY GMBH, Baden (CH)

(72) Inventors: Robert Stephen Whitehouse, Stafford (GB); Carl David Barker, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 16/491,446

(22) PCT Filed: Mar. 5, 2018

(86) PCT No.: PCT/EP2018/055365
§ 371 (c)(1),
(2) Date: Sep. 5, 2019

(87) PCT Pub. No.: WO2018/162422
PCT Pub. Date: Sep. 13, 2018

(65) Prior Publication Data
US 2020/0036281 A1  Jan. 30, 2020

(30) Foreign Application Priority Data
Mar. 6, 2017  (EP) .................... 17159423

(51) Int. Cl.
*H02M 1/084* (2006.01)
*H02M 7/155* (2006.01)
*H03K 17/76* (2006.01)

(52) U.S. Cl.
CPC ....... *H02M 1/0845* (2013.01); *H02M 7/1552* (2013.01); *H02M 7/1555* (2013.01); *H03K 17/76* (2013.01)

(58) Field of Classification Search
CPC ............. H02M 1/0845; H02M 7/1555; H02M 7/1552; H02M 1/32; H02M 5/458;
(Continued)

(56) References Cited

U.S. PATENT DOCUMENTS 4,177,508 A * 12/1979 Schmid ............... H02J 3/26
363/37
9,048,691 B2 *  6/2015 Crane ................. H02J 3/36
9,209,679 B2 * 12/2015 Sastry ............... H02M 1/4233

FOREIGN PATENT DOCUMENTS

WO  2013/056751 A1  4/2013

OTHER PUBLICATIONS

International Search Report and the Written Opinion of PCT/EP2018/055365 dated Jun. 6, 2018.
(Continued)

*Primary Examiner* — Thienvu V Tran
*Assistant Examiner* — Carlos O Rivera-Perez
(74) *Attorney, Agent, or Firm* — Eversheds Sutherland (US) LLP

(57) ABSTRACT

In the field of line commutated converters, for use in high voltage direct current (HVDC) power transmission, a line commutated converter comprises a plurality of converter limbs that extend between first and second DC terminals. Each converter limb includes first and second limb portions which are separated by an AC terminal. The first limb portions together define a first limb portion group and the second limb portions together define a second limb portion group. Each limb portion includes at least one switching element that is configured to turn on and conduct current when it is forward biased and it receives a turn on signal and to naturally turn off and no longer conduct current when it is reverse biased and the current flowing through it falls to zero. The converter also includes a control unit.

10 Claims, 4 Drawing Sheets

Figure 1:
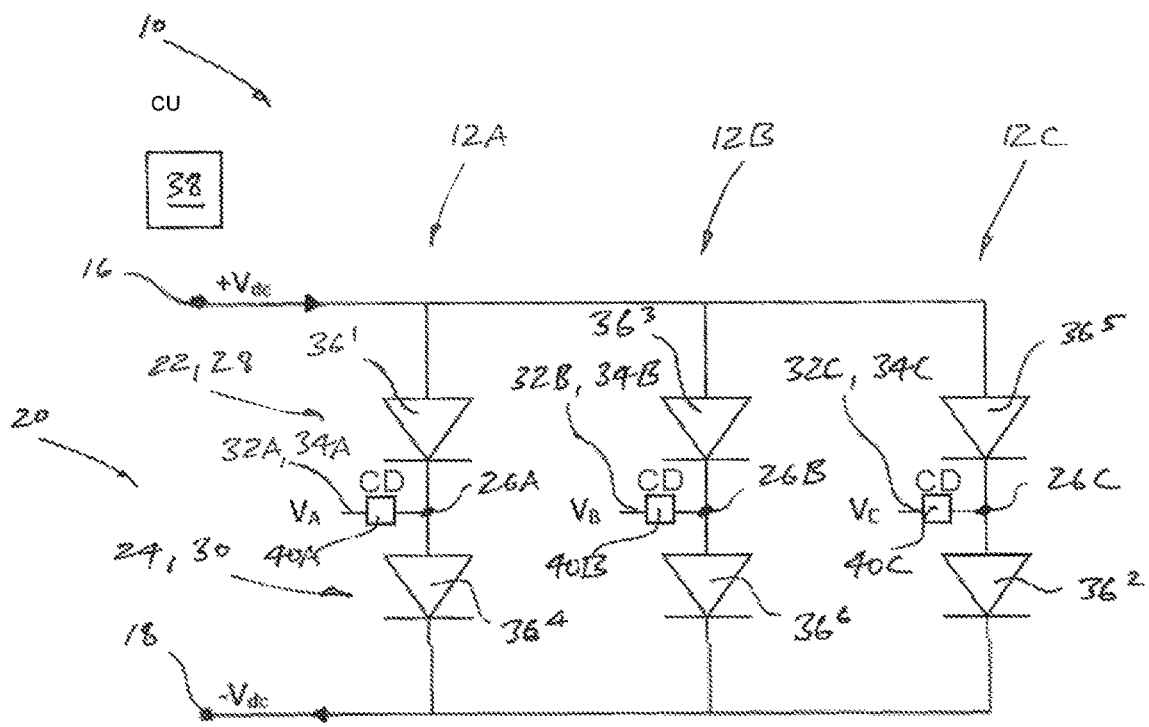

(58) Field of Classification Search
CPC .......... H02M 1/02; H02M 1/04; H02M 1/042;
H02M 1/045; H02M 1/047; H02M 1/06;
H02M 1/065; H02M 1/325; H02M 1/38;
H02M 1/08; H02M 1/081; H02M 1/083;
H02M 1/084; H02M 1/088; H02M 1/12;
H02M 7/00; H02M 7/02; H02M 7/04;
H02M 7/046; H02M 7/12; H02M 7/125;
H02M 7/145; H02M 7/15; H02M 7/151;
H02M 7/153; H02M 7/155; H02M
7/1557; H02M 7/162; H02M 7/1623;
H02M 7/21; H02M 7/217; H02M 7/2173;
H02M 7/219; H02M 7/538463; H02M
7/53854; H02M 7/42; H02M 7/483;
H02M 2001/0009; H02M 2001/0012;
H02M 2001/0016; H02M 2001/0022;
H02M 2001/0038; H02M 2001/0048;
H02M 2001/0051; H02M 2001/0054;
H02M 2001/0058; H02M 2001/385;
H02M 2007/2195; H02M 2007/4811;
H02M 5/4585; H03K 17/76; H03K 17/74;
H02H 3/00; H02H 3/08; H02H 3/081;
H02H 3/083; H02H 3/087; H02H 3/093;
H02H 3/0935; H02H 3/10; H02H 3/105;
H02J 3/36
USPC ........ 363/37–41, 97–98, 123–129, 131–132,
363/15–17, 21.01, 21.02, 21.03, 34, 35,
363/44–48, 50–56.04, 57, 58, 65–70,
363/76–79, 81–88, 135–138; 323/237,
323/238, 266, 271–277, 282–286, 351;
361/78, 79, 87, 93.1–102
See application file for complete search history.

(56) References Cited

OTHER PUBLICATIONS

European Search Report for Application No. 17159423.7 dated Aug. 21, 2017.

* cited by examiner

LINE COMMUTATED CONVERTERS

CROSS-REFERENCE TO RELATED APPLICATIONS

This application is a U.S. National Stage Application under 35 U.S.C. 371 and claims the priority benefit of International Application No. PCT/EP2018/055365 filed Mar. 5, 2018, which claims priority to EP17159423.7, filed Mar. 6, 2017, which are both incorporated herein by reference.

This invention relates to a line commutated converter.

Line commutated converters use switching elements that can only be turned on (not off) by a control signal. Such line commutated converters therefore rely on the line voltage of an AC network to which the converter is, in use, connected to effect the commutation from one switching element to its neighbour. More particularly the switching elements naturally commutate, i.e. naturally turn off and no longer conduct current, under the influence of the associated AC network which reverse biases them and causes the current flowing through them to fall to zero.

According to an aspect of the invention there is provided a line commutated converter, for use in high voltage DC power transmission, comprising:

a plurality of converter limbs extending between first and second DC terminals, each converter limb including first and second limb portions separated by an AC terminal, the first limb portions together defining a first limb portion group and the second limb portions together defining a second limb portion group, each limb portion including at least one switching element configured to turn on and conduct current when it is forward biased and it receives a turn on signal and to naturally turn off and no longer conduct current when it is reverse biased and the current flowing through it falls to zero; and a control unit programmed to, in use, control successive switching of the switching elements whereby a first switching element in the first limb portion group and a second switching element in the second limb portion group and a different converter limb to the first switching element connect two corresponding AC terminals in series between the first and second DC terminals, the control unit being further programmed to send a third switching element in the first limb portion group a turn on signal whereby the third switching element turns on and begins to conduct current while the current flowing through the first switching element begins to fall to zero and the first switching element prepares to naturally turn off, and to subsequently send a fourth switching element in the second limb portion group and a different converter limb to the third switching element a turn on signal whereby the fourth switching element turns on and begins to conduct current while the current flowing through the second switching element begins to fall to zero and the second switching element prepares to naturally turn off, and the control unit checking for an abnormal current flow associated with the first switching element during a finite monitoring period to establish whether correct natural turn off of the first switching element occurs.

Checking for an abnormal current flow, i.e. establishing whether correct natural turn off of the first switching element has occurred, during a finite monitoring period helps to ensure that such a check is completed quickly enough to allow remedial action to be taken, e.g. before turning on a further switching element. This reduces the likelihood of a second switching element in the same limb portion group failing to turn off correctly, i.e. reduces the likelihood of a "two bridge" commutation failure occurring, and the likelihood of a second switching element in the other limb portion group suffering a commutation failure, i.e. reduces the likelihood of a "double successive" commutation failure occurring.

Both such two bridge and double successive commutation failures cause the DC voltage across the DC terminals of the converter to temporarily reverse which, in use, increases the consequential disturbance to both receiving and sending end AC networks of a HVDC power transmission assembly in which the converter is located.

In addition, checking during a finite monitoring window helps to ensure that any abnormal current flow is indicative only of natural turn off, i.e. natural commutation, having not taken place.

Preferably the finite monitoring period commences when the first switching element becomes forward biased.

Having the monitoring period commence when the first switching element becomes forward biased targets the monitoring to a period when the switching element should be recovering from having previously been turned on and conducting current, and so permits the check for abnormal current flow, i.e. correct natural turn off, to start as soon as practicable and therefore allow sufficient time for remedial action to be taken, e.g. so as to reduce the likelihood of two bridge and double successive commutation failures occurring.

Optionally the control unit checks for abnormal current flow prior to the second switching element becoming forward biased.

The second switching element becoming forward biased, i.e. the voltage across the second switching element reversing and becoming positive with respect to the second switching element, is readily identifiable during control of the converter.

Such an event, i.e. the second switching element becoming forward biased, also occurs quickly enough to allow subsequent remedial action to be carried out after the monitoring period.

The control unit may check for abnormal current flow in the form of current of the same polarity as that previously flowing through the first switching element, and the control unit may establish that correct natural turn off of the first switching element has not occurred if the flow of such same polarity current is observed.

Checking for abnormal current flow in the foregoing manner desirably ignores the current (of an opposite polarity) flowing as a result of the fourth switching element being turned on and so the control unit remains able to distinguish when the first switching element has failed to naturally turn off correctly.

In a preferred embodiment of the invention the monitoring period ends when the control unit sends a turn on signal to the fourth switching element.

Such an event is easily identifiable during control of the converter.

It also occurs before the second switching element becomes reverse biased and so allows preventative remedial action to be taken, e.g. to reduce the risk of two bridge and double successive commutation failures taking place, even sooner.

Moreover, it focuses the monitoring period on a time when no current associated with the first switching element should be flowing, and so makes it even easier to establish that correct natural turn off has not occurred, i.e. simply if a current flow is observed.

In another preferred embodiment of the invention the control unit checks for abnormal current flow in the form of any current flow, and the control unit establishes that correct natural turn off of the first switching element has not occurred if the flow of any current is observed.

Such a feature helps to minimise the control unit erroneously establishing that the first switching element has failed to correctly turn off naturally.

Preferably a respective limb connector extends from each AC terminal to, in use, connect the AC terminal with a corresponding phase of a multi-phase AC network, and the control unit checks for abnormal current flow in the limb connector electrically interconnected with the first switching element via the corresponding AC terminal.

Checking for abnormal current flow in respective limb connectors allows such a check to be carried out in a single location with respect to a given converter limb while still permitting the identification of both abnormal current flow resulting from a commutation failure and normal current flow, e.g. as a result of the turn on of the other switching element in the converter limb in which the first switching element is located.

Optionally, in the event that correct natural turn off of the first switching element does not occur, the control unit alters the timing of the next turn on signal it sends to a switching element.

Such a feature reduces the risk of subsequent commutation failures, i.e. two bridge and double successive commutation failures, occurring.

The control unit may bring forward the timing of the next turn on signal it sends to a switching element.

Bringing forward the timing of the next turn on signal provides the corresponding switching element with more time to naturally commutate off, and so can help compensate for reduced voltage levels in an associated AC network under the influence of which the corresponding switching element is reverse biased and the current flowing through it caused to fall to zero.

Preferably the control unit brings forward the timing of the next turn on signal it sends to a switching element by up to 6 electrical degrees.

In a still further preferred embodiment of the invention the control unit brings forward the timing of the next three turn on signals it sends to respective switching elements.

The foregoing features achieve the desired result, i.e. reducing the likelihood of subsequent two bridge and double successive commutation failures occurring, without unduly impacting on the operation of the converter in the event of the control unit incorrectly establishing that a commutation failure has occurred.

Figure 2A:
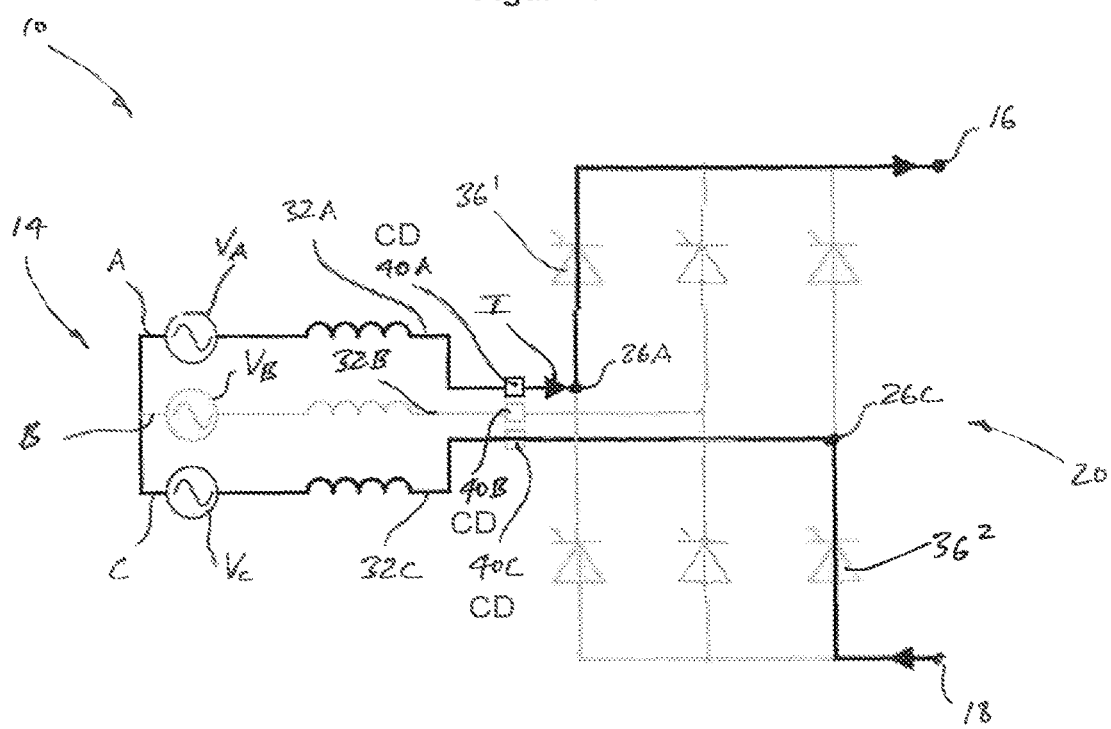
Figure 2B:
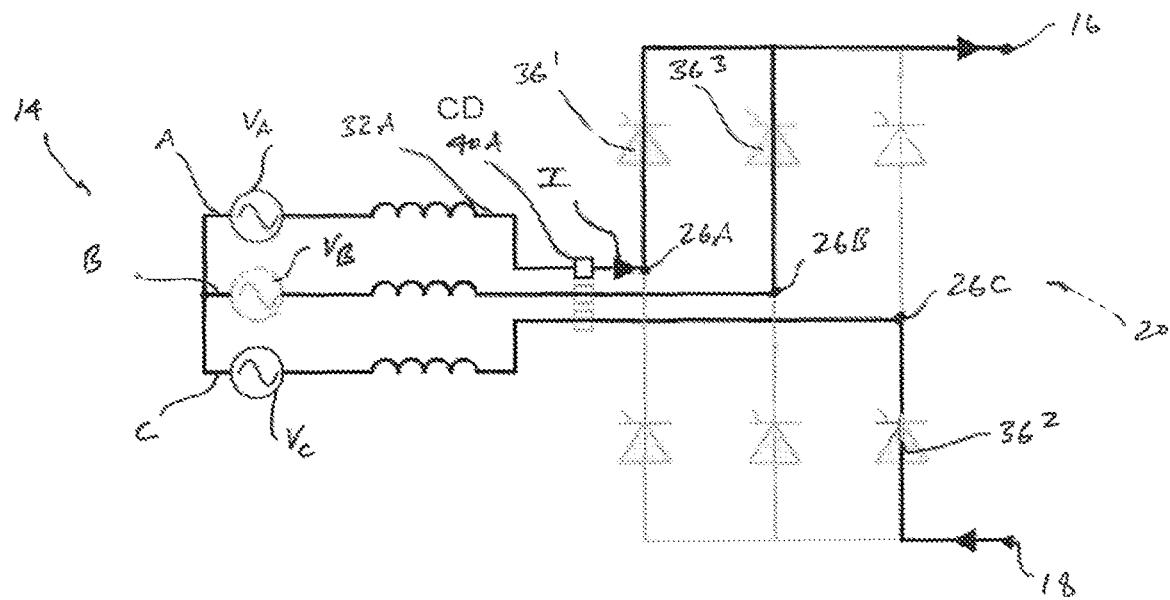
Figure 2C:
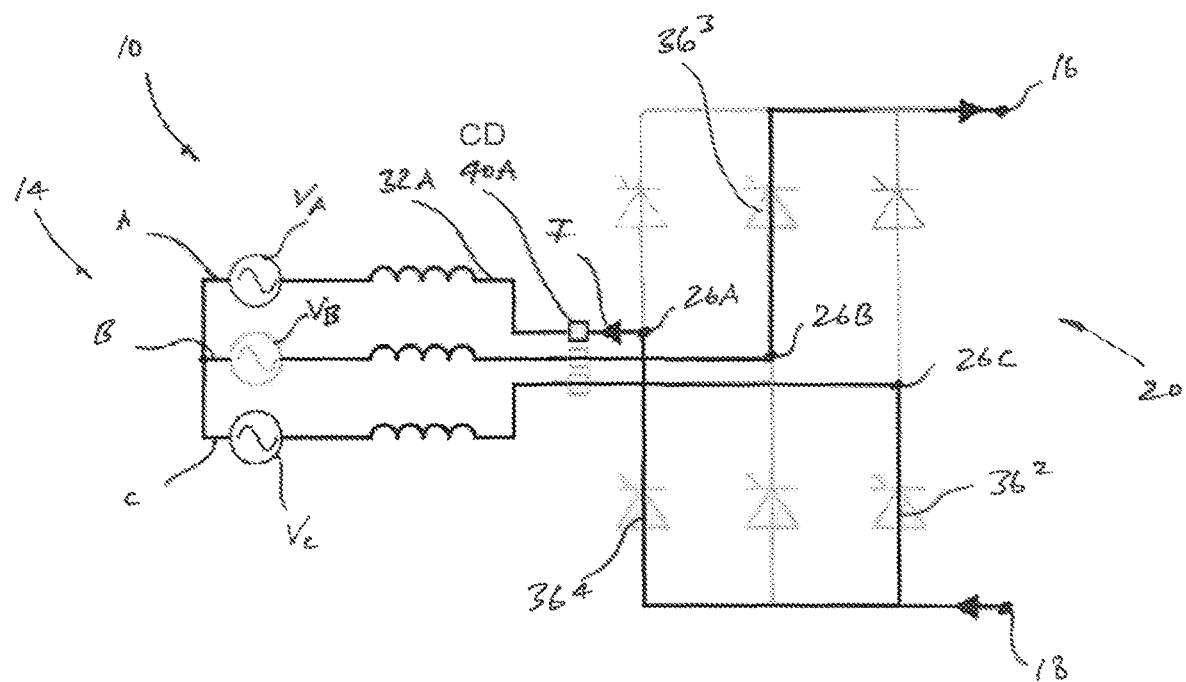
Figure 3:
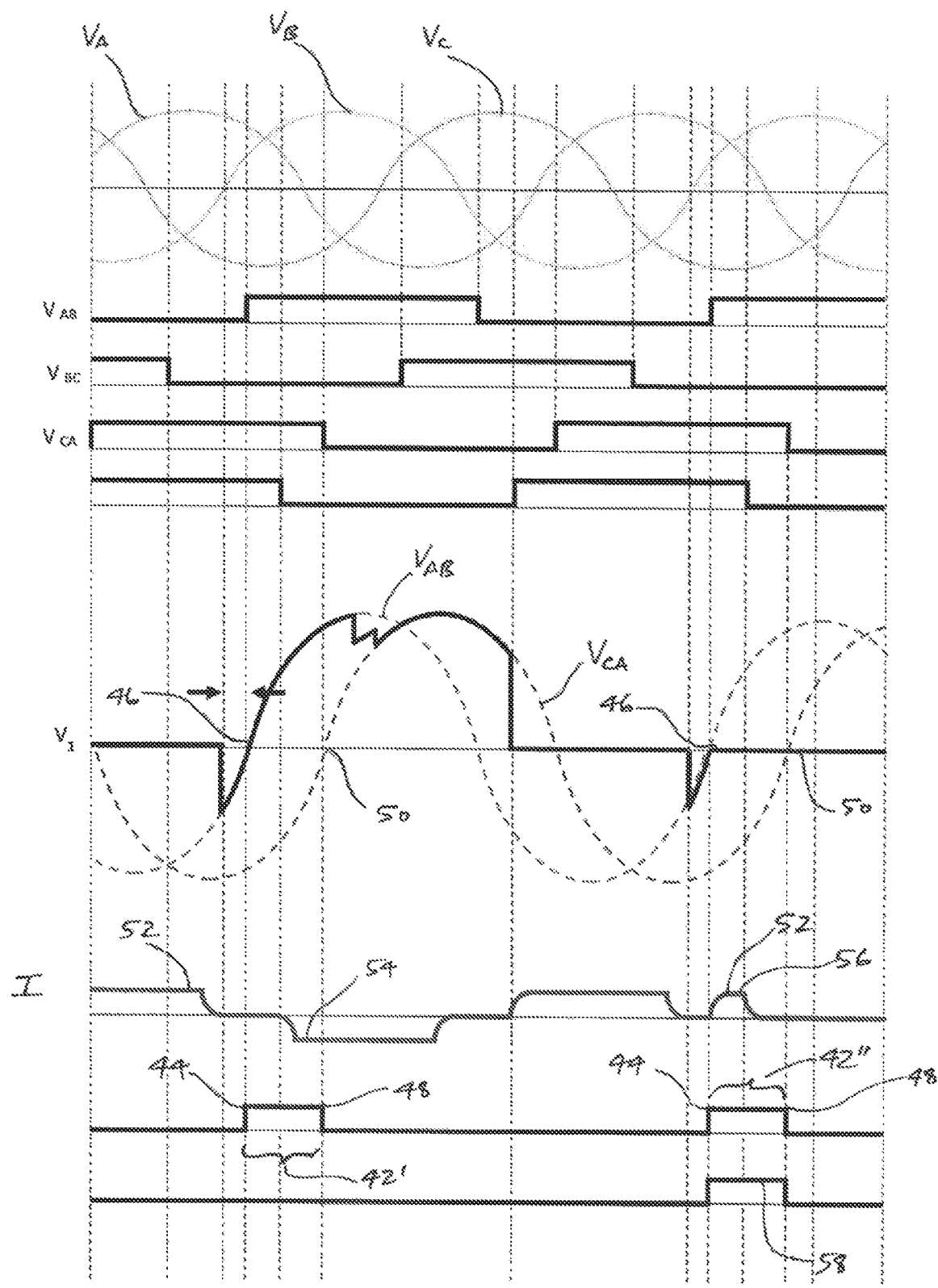
Figure 4:
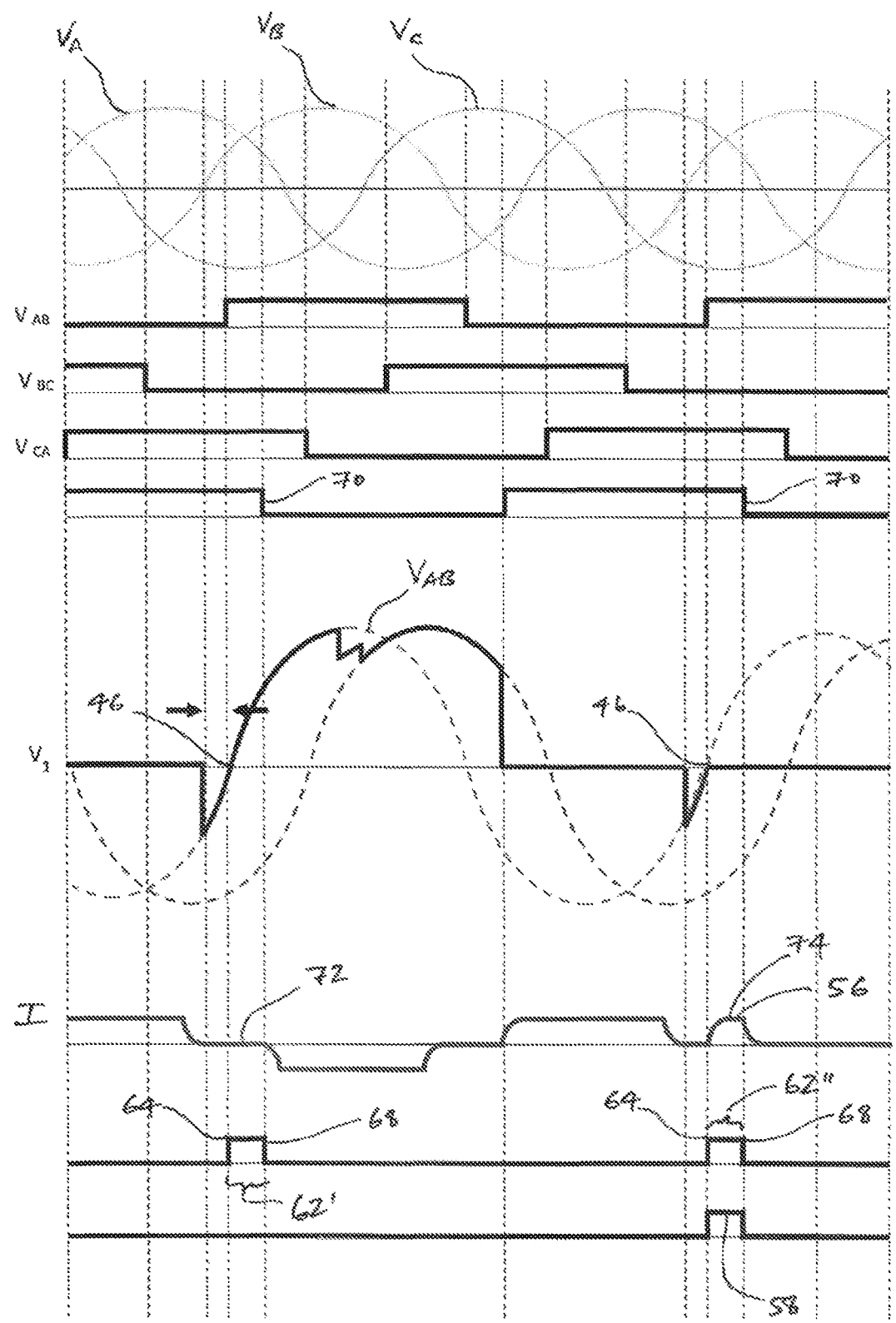

There now follows a brief description of preferred embodiments of the invention, by way of non-limiting example, with reference being made to the following figures in which:

FIG. 1 shows a schematic view of a line commutated converter according to an embodiment of the invention;

FIGS. 2(*a*) to 2(*c*) illustrate normal operation of the line commutated converter shown in FIG. 1;

FIG. 3 illustrates operation of a control unit within the line commutated converter shown in FIG. 1 to establish whether correct natural turn off of a first switching element within the converter has occurred; and FIG. 4 illustrates operation of an alternative control unit within the line commutated converter shown in FIG. 1 to establish whether correct natural turn off of a first switching element within the converter has occurred.

A line commutated converter according to a first embodiment of the invention is designated generally by reference numeral 10, as shown in FIG. 1.

The line commutated converter 10 includes three converter limbs 12A, 12B, 12C, each of which corresponds to a respective phase A, B, C of an AC network 14 with which the converter 10 is, in use, operatively connected. Other embodiments of the invention may include fewer than or more than three converter limbs according to the commensurate number of phases included in an associated AC network.

Each converter limb 12A, 12B, 12C extends between first and second DC terminals 16, 18 which, in use, are operatively connected with a DC network 20. Each converter limb 12A, 12B, 12C also includes first and second limb portions 22, 24 which are separated by a corresponding AC terminal 26A, 26B, 26C. The first limb portions 22 together define a first limb portion group 28 and the second limb portions 24 together define a second limb portion group 30.

A respective limb connector 32A, 32B, 32C extends from each AC terminal 26A, 26B, 26C to, in use, connect the AC terminal 26A, 26B, 26C with a corresponding phase A, B, C of the multi-phase, i.e. three-phase, AC network 14. In the embodiment shown each limb connector 32A, 32B, 32C incorporates the winding of a transformer (not shown) and so takes the form of a respective limb winding 34A, 34B, 34C.

In the embodiment shown each limb portion 22, 24 includes a single switching element $36^1$, $36^2$, $36^3$, $36^4$, $36^5$, $36^6$, although more switching elements may optionally be included in each limb portion 22, 24. Each switching element $36^1$, $36^2$, $36^3$, $36^4$, $36^5$, $36^6$ is a thyristor which is configured to turn on and conduct current when it is forward biased and it receives a turn on signal, and to naturally turn off and no longer conduct current when it is reverse biased and the current flowing through it falls to zero. Other semiconductor switching elements may, however, be used, as may other switching elements such a gas tube switching devices.

In addition the converter 10 includes a control unit 38 that is programmed to control successive switching of the switching elements $36^1$, $36^2$, $36^3$, $36^4$, $36^5$, $36^6$.

Also, each limb connector 32A, 32B, 32C, i.e. each limb winding 34A, 34B, 34C, includes a corresponding current detector 40A, 40B, 40C which is able to both identify when current is flowing through the corresponding limb connector 32A, 32B, 32C as well as establish the polarity, i.e. direction, of current flowing therethrough.

In use, the control of successive switching of the switching elements $36^1$, $36^2$, $36^3$, $36^4$, $36^5$, $36^6$ by the control unit 38 leads to a first switching element $36^1$, $36^2$, $36^3$, $36^4$, $36^5$, $36^6$ in the first limb portion group 28, and a second switching element $36^1$, $36^2$, $36^3$, $36^4$, $36^5$, $36^6$ in the second limb portion group 30 and a different converter limb 12A, 12B, 12C to the first switching element, connecting two corresponding AC terminals 26A, 26B, 26C, i.e. the AC terminals 26A, 26B, 26C with which the aforementioned first and second switching elements $36^1$, $36^2$, $36^3$, $36^4$, $36^5$, $36^6$ are associated, in series between the first and second DC terminals 16, 18.

For example, as shown in FIG. 2(*a*), initially a first switching element $36^1$ in the first limb portion group 28 and a second switching element $36^2$ in the second limb portion group 30 connect two of the AC terminals 26A, 26C, and thereby two of the phases A, C of the AC network 14, in series between the first and second DC terminals 16, 18.

The control unit 38 is further programmed, in use, to send a third switching element 36³ in the first limb portion group 28 a turn on signal whereby the third switching element 36³ turns on and begins to conduct current while the current flowing through the first switching element 36¹ begins to fall to zero and the first switching element 36¹ prepares to naturally turn off, as shown schematically in FIG. 2(*b*).

The control unit 38 is also programmed, in use, to subsequently send a fourth switching element 36⁴ in the second limb portion group 30 and a different converter limb 12A to the third switching element 36³ a turn on signal whereby the fourth switching element 36⁴ turns on and begins to conduct current while the current flowing through the second switching element 36² begins to fall to zero and the second switching element 36² prepares to naturally turn off, as shown schematically in FIG. 2(*c*).

Accordingly, during further operation of the converter 10 other first and second switching elements 36³, 36⁴, 36⁵, 36⁶ successively connect two corresponding AC terminals 26A, 26B, 26C, and thereby two corresponding phases A, B, C of the AC network 14, between the DC terminals 16, 18, and thereafter prepare to naturally turn off.

It follows that the checking described below in relation to an example first switching element 36¹, is carried out by the control unit 38 in relation to each switching element 36¹, 36², 36³, 36⁴, 36⁵, 36⁶ as and when they are successively expected to naturally turn off during the continued and ongoing operation of the converter 10.

By way of example, the control unit 38 checks for an abnormal current flow associated with the first switching element 36¹ during a finite monitoring period 42', 42" as illustrated in FIG. 3, to establish whether correct natural turn off of the first switching element 36¹ occurs.

The finite monitoring period 42', 42" commences 44 when the first switching element 36¹ becomes forward biased 46, i.e. when the voltage $V_1$ across the first switching element 36¹ (as defined at that particular time by the phase to phase voltage $V_{AB}$ between phases A and B of the AC network 14) reverses and becomes positive with respect to the first switching element 36¹.

In the embodiment shown the monitoring period 42', 42" ends 48 when the second switching element 36² becomes forward biased 50, i.e. when the voltage across the second switching element 36² (as defined at that time by the phase to phase voltage $V_{CA}$ between phases C and A of the AC network 14) reverses and becomes positive with respect to the second switching element 36². In this manner the control unit 38 checks for abnormal current flow prior to the said second switching element 36² becoming forward biased 50.

More particularly, the control unit 38 checks for abnormal current flow in the form of current of the same polarity as that previously flowing through the first switching element 36¹. More particularly still, the control unit 38 uses the current detector 40A in the phase A limb connector 32A, i.e. the current detector 40A electrically interconnected with the first switching element 36¹ via the corresponding phase A AC terminal 26A, to check for such abnormal current flow.

In this regard the current I previously flowing through the first switching element 36¹ (as shown in FIG. 2(*b*)), i.e. as the first switching element 36¹ prepares to naturally turn off, has a positive polarity 52.

Following correct natural turn off of the first switching element 36¹, e.g. during a first finite monitoring period 42', the current I flowing through the phase A current detector 40A (which arises because of the fourth switching element 36⁴ being turned on and starting to conduct, i.e. as shown in FIG. 2(*c*)) has a negative polarity 54.

Such current flow is therefore not considered an abnormal current flow by the control unit 38 and so the control unit 38 does not indicate that a commutation failure has occurred with respect to the first switching element 36¹, i.e. does not indicate that correct natural turn off of the first switching element 36¹ has failed to occur.

In contrast, e.g. during a second finite monitoring period 42", if the current I flowing through the phase A current detector 40A has the same positive polarity 54 as the current I previously flowing through the first switching element 36¹ it is considered by the control unit 38 to be an abnormal current flow 56. The control unit 38 therefore establishes 58 that correct natural turn off of the first switching element 36¹ has not occurred, i.e. a commutation failure has occurred with respect to the first switching element 36¹.

Thereafter, i.e. in the event that correct natural turn off of the first switching element 36¹ does not occur, the control unit 38 alters the timing of the next turn on signal it sends to a switching element 36¹, 36², 36³, 36⁴, 36⁵, 36⁶, and more particularly brings forward the timing of the turn on signal it sends to the fifth switching element 36⁵ by 6 electrical degrees. In other embodiments of the invention the control unit may bring forward the timing of the next turn on signal it sends by less than 6 electrical degrees.

The control unit 38 may additionally bring forward the timing of two further turn on signals it sends to respective further switching elements 36¹, 36², 36³, 36⁴, 36⁵, 36⁶, e.g. a sixth switching element 36⁶.

In an alternative embodiment of the invention, the control unit of the first line commutated converter 10 may instead check for abnormal current flow 42 in a different manner to that described herein above.

More particularly, the alternative control unit may check for abnormal current flow during a different, further finite monitoring period 62' 62", as illustrated in FIG. 4.

The further finite monitoring period 62', 62" again commences 64 when the first switching element 36¹ becomes forward biased 46, i.e. when the voltage $V_1$ across the first switching element 36¹ (as defined at that particular time by the phase to phase voltage $V_{AB}$ between phases A and B of the AC network 14) reverses and becomes positive with respect to the first switching element 36¹. The further finite monitoring period 62', 62" differs, however, in that it ends 68 when the control unit 38 sends a turn on signal 70 to the fourth switching element 36⁴.

In addition, the alternative control unit checks for abnormal current flow in the form of any current flow through the phase A current detector 40A in the phase A limb connector 32A, i.e. the limb connector 32A electrically interconnected with the first switching element 36¹ via the corresponding phase A AC terminal 26A.

In this regard, following correct natural turn off of the first switching element 36¹, e.g. during a first further finite monitoring period 62', no current 72 flows through the phase A current detector 40A, not least because the fourth switching element 36⁴ has not yet been turned on.

Since no current flow is observed by the alternative control unit, it does not indicate that a commutation failure has occurred with respect to the first switching element 36¹, i.e. it does not indicate that correct natural turn off of the first switching element 36¹ has failed to occur.

In contrast, e.g. during a second further finite monitoring period 62", if any current 74 does flow through the phase A current detector 40A it is considered by the alternative control unit to be an abnormal current flow 56. The alternative control unit therefore establishes 58 that correct natural turn off of the first switching element 36$^1$ has not occurred, i.e. a commutation failure has occurred with respect to the first switching element 36$^1$.

Thereafter, i.e. in the event that correct natural turn off of the first switching element 36$^1$ does not occur, the alternative control unit again preferably alters the timing of the next turn on signal it sends to a switching element 36$^1$, 36$^2$, 36$^3$, 36$^4$, 36$^5$, 36$^6$, and more particularly preferably brings forward the timing of the turn on signal it sends to the fifth switching element 36$^5$ by 6 electrical degrees.

The alternative control unit may also additionally bring forward the timing of two further turn on signals it sends to respective further switching elements 36$^1$, 36$^2$, 36$^3$, 36$^4$, 36$^5$, 36$^6$, e.g. a sixth switching element 36$^6$ and then to the first switching element.

The invention claimed is:

1. A line commutated converter, for use in high voltage DC power transmission, comprising:
    a plurality of converter limbs extending between first and second DC terminals, each converter limb including first and second limb portions separated by an AC terminal, the first limb portions together defining a first limb portion group and the second limb portions together defining a second limb portion group, each first and second limb portions including at least one switching element configured to turn on and conduct current when it is forward biased and it receives a turn on signal and to naturally turn off and no longer conduct current when it is reverse biased and the current flowing through it falls to zero; and
    a control unit programmed to, in use, control successive switching of switching elements whereby a first switching element in the first limb portion group and a second switching element in the second limb portion group and a different converter limb to the first switching element connect two corresponding AC terminals in series between the first and second DC terminals,
    the control unit being further programmed to send a third switching element in the first limb portion group a turn on signal whereby the third switching element turns on and begins to conduct current while the current flowing through the first switching element begins to fall to zero and the first switching element prepares to naturally turn off, and to subsequently send a fourth switching element in the second limb portion group and a different converter limb to the third switching element a turn on signal whereby the fourth switching element turns on and begins to conduct current while the current flowing through the second switching element begins to fall to zero and the second switching element prepares to naturally turn off, and
    the control unit checking for an abnormal current flow associated with the first switching element during a finite monitoring period to establish whether correct natural turn off of the first switching element occurs, wherein the finite monitoring period commences when the first switching element becomes forward biased, and the control unit checking for the abnormal current flow further comprises:
        receiving a signal indicating that the first switching element becomes forward biased; and
        sending a current detector a turn on signal based on the signal, wherein the current detector is electrically interconnected with the first switching element via the AC terminal.

2. The line commutated converter according to claim 1, wherein the control unit checks for abnormal current flow prior to the second switching element becoming forward biased.

3. The line commutated converter according to claim 2, wherein the control unit checks for abnormal current flow in a form of current of the same polarity as that previously flowing through the first switching element, and the control unit establishes that correct natural turn off of the first switching element has not occurred if the abnormal current flow of such same polarity current is observed.

4. The line commutated converter according to claim 1, wherein the finite monitoring period ends when the control unit sends the turn on signal to the fourth switching element.

5. The line commutated converter according to claim 4, wherein the control unit checks for abnormal current flow in a form of any current flow, and the control unit establishes that correct natural turn off of the first switching element has not occurred if the abnormal current flow of any current is observed.

6. The line commutated converter according to claim 1, wherein a respective limb connector extends from each AC terminal to, in use, connect the AC terminal with a corresponding phase of a multi-phase AC network, and the control unit checks for abnormal current flow in a limb connector electrically interconnected with the first switching element via a corresponding AC terminal.

7. The line commutated converter according to claim 1, wherein in an event that correct natural turn off of the first switching element does not occur the control unit alters timing of the next turn on signal it sends to the switching element.

8. The line commutated converter according to claim 7, wherein the control unit brings forward the timing of the next turn on signal it sends to the switching element.

9. The line commutated converter according to claim 8, wherein the control unit brings forward the timing of the next turn on signal it sends to the switching element by up to 6 electrical degrees.

10. The line commutated converter according to claim 8, wherein the control unit brings forward the timing of the next three turn on signals it sends to respective switching elements.

* * * * *